United States Patent [19]

Marchetti et al.

[11] Patent Number: 4,623,578

[45] Date of Patent: Nov. 18, 1986

[54] EPOXY CROSSLINKED COPOLYMERS OF POLYANHYDRIDES AND LAMINATES THEREFROM

[75] Inventors: Joseph R. Marchetti, Hempfield Township, Mercer County; Zal N. Sanjana, Penn Hills; Edward Elikan, Pennsbury Village, all of Pa.

[73] Assignee: Westinghouse Electric Corp., Pittsburgh, Pa.

[21] Appl. No.: 720,108

[22] Filed: Apr. 4, 1985

[51] Int. Cl.[4] .................. C08F 222/08; C08G 59/44; C08G 73/10

[52] U.S. Cl. ................................ 428/209; 428/416; 428/901; 523/439; 525/109; 525/117; 528/99

[58] Field of Search ................. 525/109, 117; 528/99; 428/416, 209, 901; 523/439

[56] References Cited

U.S. PATENT DOCUMENTS

| | | | |
|---|---|---|---|
| 3,528,935 | 9/1970 | Marion et al. | 523/439 X |
| 3,562,223 | 2/1971 | Bargain et al. | 260/78 |
| 3,637,579 | 1/1972 | Barie et al. | 523/439 X |
| 4,012,350 | 3/1977 | Burke et al. | 525/109 X |
| 4,056,506 | 11/1977 | Heilman et al. | 523/439 |
| 4,128,598 | 12/1978 | Makino et al. | 528/99 X |
| 4,273,889 | 6/1981 | Yamazaki et al. | 528/109 |
| 4,388,451 | 6/1983 | Culbertson et al. | 525/109 X |

OTHER PUBLICATIONS

Sroog, "Polyimides", J. Poly. Sci.: Part C, No. 16, 1191–1209, (1967).

Primary Examiner—Earl Nielsen
Attorney, Agent, or Firm—R. D. Fuerle

[57] ABSTRACT

The invention discloses a polyfunctional imide-containing phenolic imide which is the reaction product of a polyanhydride having at least three anhydride groups and aromatic compound having a single aromatic primary amine group. A varnish is prepared by the addition of an epoxy crosslinking agent to the imide. Fibrous substrates can be impregnated with the varnish and partially cured to prepare prepregs, and stacks of prepregs can then be heated and pressed to prepare laminates or printed circuit boards.

37 Claims, 1 Drawing Figure

U.S. Patent    Nov. 18, 1986    4,623,578
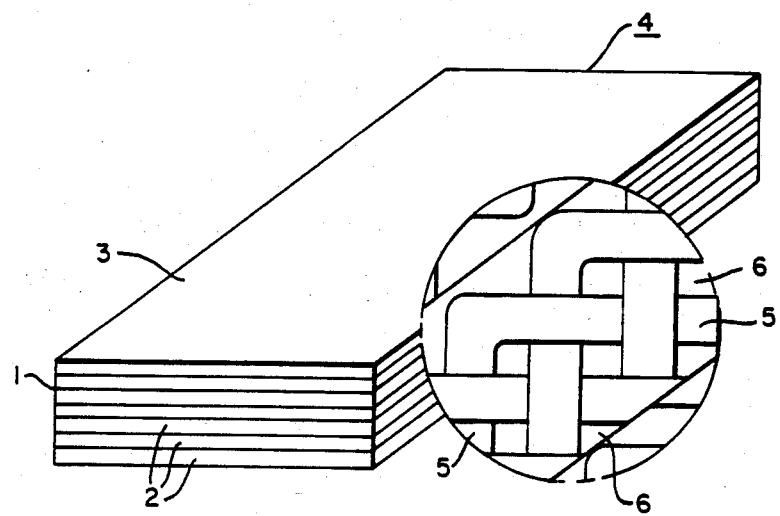

EPOXY CROSSLINKED COPOLYMERS OF POLYANHYDRIDES AND LAMINATES THEREFROM

BACKGROUND OF THE INVENTION

Laminates are prepared by impregnating sheets of a fibrous substrate with a resin. The resin is partially cured to form a prepreg. The prepregs are then stacked and heated under pressure to form the laminate.

While polyimide resins have very desirable thermal properties, they have until recently been unsuitable for use in preparing laminates because they were relatively insoluble when fully imidized. Since the early 1960's there has been an industry worldwide effort to develop high performance polyimide-based laminating resins. The impetus for this research has been the ever-increasing demands by the circuit board industry for high performance laminates.

Polyimide resins are generally prepared by reacting a dianhydride with a diamine to produce a soluble polyamic acid which is then heated to condense out water and form the imide groups:

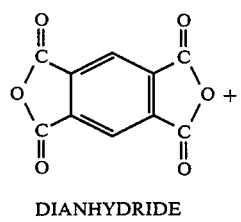

DIANHYDRIDE

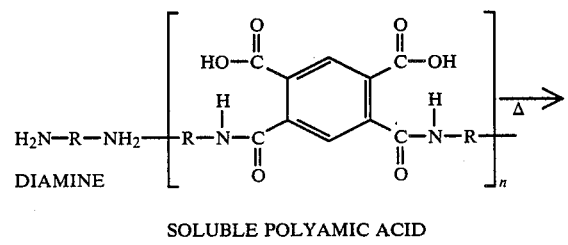

SOLUBLE POLYAMIC ACID

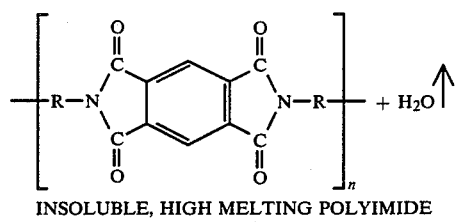

INSOLUBLE, HIGH MELTING POLYIMIDE

Polyimides prepared by this route are unsuitable for use in making laminates because, if the polyamic acid stage is impregnated into the prepreg, water will be given off when the laminate is fully cured in the laminating press and the water will lead to voids in the laminate and weaken the laminate. A prepreg cannot be prepared with the polyimide itself as they are generally insoluble in organic solvents, and, due to their inherently high melting points, very high temperatures would be required in the laminating press to cause the prepregs to adhere to themselves.

U.S. Pat. No. 3,562,223 discloses a commercial polyimide laminating resin which avoids these difficulties, but requires a post cure at a high temperature. It is a polyaminobismaleimide prepared by reacting an aromatic diamine with a mixture of bismaleimide and partially addition polymerized bismaleimide.

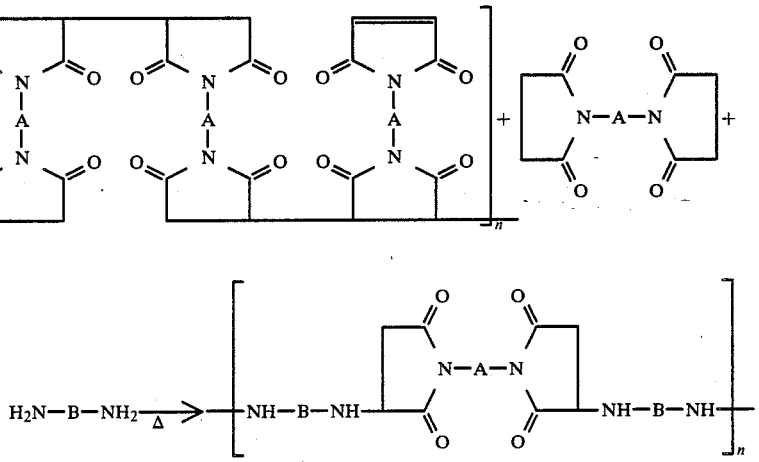

The product is soluble and can be used to form prepregs which can then be fully cured in the laminating press.

SUMMARY OF THE INVENTION

We have discovered an alternative route to preparing a polyimide laminating resin. In our method we prepare a varnish which is a solution of polyfunctional imide-containing phenolic imide and an epoxy resin. Prepregs are impregnated with the varnish and the phenolic imide is fully cured in the laminating press by crosslinking with the epoxy resin. This method of preparation has the advantage that no volatiles are emitted during the final cure in the laminating press. Also, the method of preparation is very flexible, permitting a wide variation of alternative types of polyimides which can be made for specialized applications. No post cure is required for laminates prepared according to this invention.

DESCRIPTION OF THE INVENTION

The accompanying drawing is an isometric view partially in section and having an enlargement window, showing a certain presently preferred embodiment of a laminate according to this invention.

In the drawing, a stack 1 of prepregs 2 having a copper foil 3 at one end of the stack has been heated under pressure to form laminate 4. Each prepreg 2 consists of a fibrous substrate 5 impregnated with a laminating varnish 6.

In the first step of the process of this invention, a polyfunctional imide-containing phenolic imide is prepared by reacting a polyanhydride with an amino aromatic compound.

The polyanhydride is an organic compound having three or more anhydride groups. It may be purchased commercially or it can be prepared by, for example, polymerizing a monomer having an anhydride group. Any anhydride which has ethylenic unsaturation is a candidate for polymerization to prepare the polyanhydride. Maleic anhydride is preferred because of its reactivity. Since maleic anhydride cannot be easily homopolymerized, it is usually copolymerized with another ethylenically unsaturated monomer, such as butadiene, polybutadiene, acrylic acid, acrylonitrile, methacrylic acid, methacrylonitrile, linseed oil, soybean oil, and styrene. The preferred monomer for copolymerization with maleic anhydride is styrene as it has been found to work very well. Groups which react with the anhydride group, such as hydroxyl or amine groups, should not be present on the monomer that is copolymerized with the maleic anhydride as this will prevent the subsequent formation of an imide group.

Maleic anhydride copolymerizes with another ethylenically unsaturated monomer according to the general equation:

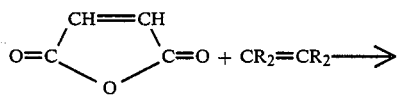

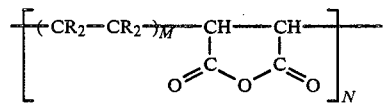

where M is up to 10; N is between 3 and the solubility limit of the polymer and R is hydrogen, aralkyl, or alkaryl. If M is over ten, the product will have a low crosslink density and poor properties. M is preferably as low as possible but if M is too low the maleic anhydride will not polymerize. If N is less than two, there will be no crosslinking and if N is too large, the copolymer will not be soluble and one will not be able to make a laminate from it. The reaction of the maleic anhydride with the monomer it copolymerizes with will proceed without a catalyst by heating as is known in the art. Sufficient solvent should be present to permit stirring of the solution. Suitable solvents include dimethyl formamide, methyl ethyl ketone, acetone, dimethyl acetamide and n-methylpyrollidone. Dimethyl formamide is preferred because it has been found to work well.

The amino aromatic compound which is reacted with the polyanhydride to form the phenolic imide may have any molecular weight, but it must have only a single amine group or the resulting phenolic imide will gel during resin preparation. Also, the single amine group must be a primary aromatic amine in order to subsequently form an imide group. The aromatic compound preferably contains at least one hydroxyl group to permit the phenolic imide to be crosslinked by reaction with the epoxy resin, which is subsequently added to the phenolic imide to form the varnish. While the aromatic compound may contain more than one hydroxyl group, preferably only a single hydroxyl group is present because if more than one hydroxyl group is present, the phenolic imide may gel during its preparation. The hydroxyl group is preferably an aromatic hydroxyl group because it imparts higher reactivity into the final composition. The amount of crosslinking with the epoxy resin can be reduced if desired by adding an aromatic compound, such as aniline, which does not contain a hydroxyl group. Reduction of the amount of crosslinking may be desirable to improve the flow characteristics of the varnish. The aromatic compound preferably has only a single aromatic ring as those compounds form more soluble and more stable phenolic imides, but aromatic compounds which have more than one ring, joined or separate, can also be used. P-aminophenol is preferred because of its low molecular weight and high reactivity. Up to about ½ equivalent per equivalent of anhydride of the aromatic compound may be used.

In the reaction of the polyanhydride with the amino aromatic compound to form a phenolic imide, a polyamic acid intermediate is formed first from which water condenses out to form the polyimide. The following gives the reaction of a styrene-maleic anhydride copolymer with p-aminophenol:

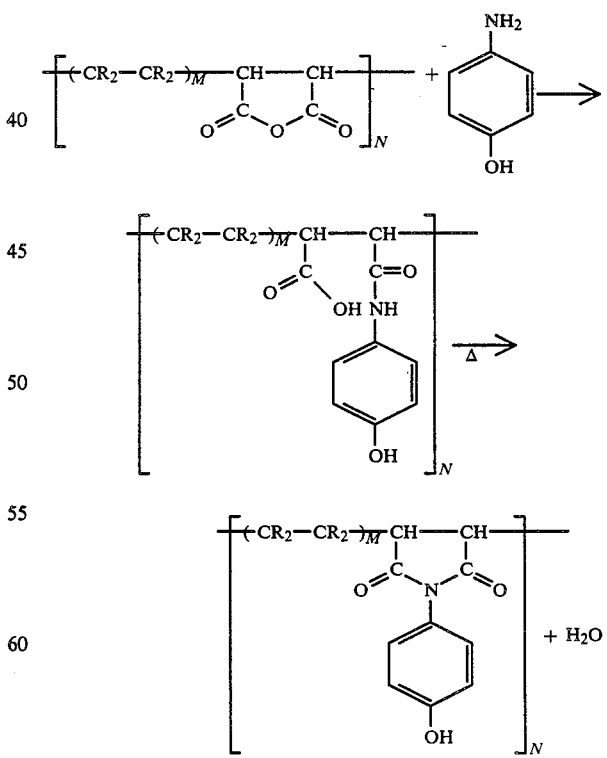

A temperature of about 130° C. is typically required to imidize the polyanhydride and form the phenolic imide, but no catalyst is needed. The polyanhydride and the aromatic compound are dissolved in an organic solvent for the reaction.

The solvent that is used should not react with the anhydride unless, for example, it is desired to form half ester groups instead of imide groups. Half ester groups are sometimes desirable to improve the flow of the copolymer. If a solvent containing hydroxyl groups such as butanol, 2-ethylhexanol or methyl cellosolve is used as part of the solvent system, the hydroxyl groups on the solvent will react with the anhydride groups to form half esters. An alternative to improving the flow, however, is to start with a polymer having fewer anhydride groups.

An impregnating varnish is prepared from the phenolic imide by forming a solution of the phenolic imide and an epoxy crosslinking agent in an organic solvent. Any type of epoxy resin may be used, including bisphenol-A epoxy resins, bisphenol-S epoxy resins, novolac epoxy resins, cycloaliphatic epoxy resins, hydantain epoxy resins, and brominated epoxy resins. The preferred epoxy resin is a bisphenol-A epoxy resin because they are readily available and inexpensive. The epoxy resin may have any molecular weight as long as it is soluble in the solvent system. The epoxy resin is used in an amount from about stoichiometric with the phenolic imide to about 25 percent in excess of stoichiometric. Preferably, the epoxy resin is about 8 to about 12 percent in excess of stoichiometric with the phenolic imide. If less epoxy resin is used, there will be residual aromatic hydroxyl groups in the varnish which are reactive in the laminate, giving it poor chemical resistance, and if more epoxy resin is used, the laminate will also have poor chemical resistance and will not be sufficiently hard.

Sufficient solvent must be present to dissolve both the phenolic imide and the epoxy resin and to give a viscosity to the varnish such that it can be easily impregnated onto the fibrous substrate. A viscosity of about 50 to about 1000 centipoises is usually considered to be necessary, as a viscosity of less than 50 may be too thin, and a viscosity over 1000 may be too thick.

While a catalyst is not required for the phenolic imide-epoxy reaction, up to about 1 percent by weight (based on total solids weight) of a catalyst may be included if desired. The preferable amount of catalyst is about 0.2 percent by weight. Suitable catalysts are well known in the art and include imidazoles and benzyldimethylamine. The preferred catalyst is 2-methyl imidazole because it has been found to work very well. The varnish may also contain various fillers, pigments, flame retardants, etc. as is desired.

The varnish is then used to impregnate a fibrous substrate and form a prepreg. Any sheet of fibrous material including quartz, glass cloth, "Kevlar" (a polyaramide fiber), graphite cloth, paper, canvas, etc. can be used. About 35 to about 55 percent by weight resin solids, (based on total composite weight), are used to 45 to 65 percent by weight of the fibrous substrate. The fibrous substrate is immersed into the varnish, excess varnish is removed from the impregnated fibrous substrate, and the varnish remaining on the fibrous substrate is partially cured, or "B-staged." During partial cure, the impregnated fibrous substrate is heated sufficiently to evaporate the solvents that are present and react the epoxy resin with at least some of the hydroxyl groups on the phenolic imide, which partially crosslinks the polymer. The reaction of the epoxy resin with the hydroxyl groups of the imide is as follows for the styrene-maleic anhydride-p-aminophenol phenolic imide:

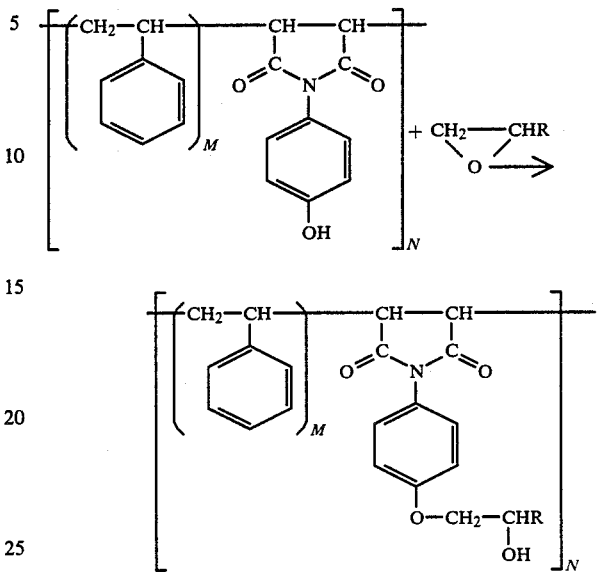

Typically, this will require about 2 to about 5 minutes at 150° to 180° C. The resulting prepreg is cooled under pressure to avoid warping.

The prepreg is then cut and stacked, (cross-ply, if desired) and the stack is placed in a laminating press where it is heated under pressure to form the composite or laminate. If a circuit board is to be formed, copper foil can be placed at one or both ends of the stack prior to it being placed in the laminating press. The copper foil is then etched or otherwise partially removed to form a circuit pattern. The varnish can also be used as an adhesive by B-staging or partially curing the varnish and applying it to a surface, or by using the prepreg itself as an adhesively-backed sheet. It can also be used as a wire enamel by passing a wire through a bath of the varnish, removing excess varnish, and heating to evaporate the solvent and crosslink the novolac.

Instead of using an epoxy resin, a varnish can also be prepared from about 1 to about 15% by weight hexamethylenetetramine and about 85 to about 95% of the phenolic novolac; this varnish can be used for molding applications.

The examples which follow further illustrate this invention.

EXAMPLES

In these examples, the following raw materials were used:

(1) Low molecular weight copolymers of styrene and maleic anhydride having styrene to maleic anhydride molar ratios of 1:1, 2:1, and 3:1, sold by Arco Chemical Company under the trade designations "SMA 1000," "SMA 2000," and "SMA 3000," respectively. The following table gives the properties of these resins.

| SMA Resin | Molecular Weight | Melting Point, °C. | Acid Value, mg KOH/gm | Anhydride Equiv. Wt., gm/Equiv. |
| --- | --- | --- | --- | --- |
| 1000 | 1,600 | 150–170 | 480 | 234 |
| 2000 | 1,700 | 140–160 | 350 | 321 |

-continued

| SMA Resin | Molecular Weight | Melting Point, °C. | Acid Value, mg KOH/gm | Anhydride Equiv. Wt., gm/Equiv. |
| --- | --- | --- | --- | --- |
| 3000 | 1,900 | 115-130 | 275 | 408 |

(2) A solid linear polyanhydride derived from 1-octadecene and maleic anhydride in a 1:1 molar ratio, supplied by Gulf Oil under the trade designation "PA-18." This material has a molecular weight of about 50,000 grams/mole and was supplied at 100 percent solids in free-flowing powder form.

(3) A diglycidyl ether of 2,2-bis-(4-hydroxyphenyl) propane sold by Shell Chemical Company under the trade designation "Epon 828." This material is made by reacting epichlorohydrin with bisphenol-A; it has an epoxy equivalent weight of 188.5 grams/equivalent.

(4) A tetrabrominated diglycidyl ether type epoxy resin containing 19 to 21% by weight bromine on a solids basis, sold by Dow Chemical Company under the trade designation "DER 521-A-75." This material was supplied at 75% by weight solids in acetone and had an average epoxide equivalent weight of 437.5 grams/equivalent.

EXAMPLE 1

Preparation of styrene N-p-Hydroxyphenyl Maleimide Copolymer

A 3,000 ml round bottom, three necked flask fitted with an agitator, nitrogen inlet tube, thermometer, reflux condenser, and a means for heating was charged with 394.0 grams of dimethyl formamide (DMF). The flask was swept with nitrogen gas for five minutes and the flow rate of the nitrogen was adjusted to maintain a slight positive nitrogen pressure in the flask throughout the balance of the run. The agitator was started and the DMF was slowly heated to 50° C. Then 428.8 grams (1.8 equiv.) of neat "SMA 1000" copolymer was added to the hot DMF at such a rate as to prevent clumping. After the addition of the "SMA 1000" copolymer was completed, the slurry was heated to 106° C. to completely dissolve the "SMA 1000." The solution was then cooled to 100° C. and 194.2 grams (1.78 equiv.) of powdered p-aminophenol was slowly added to the flask over a five minute period. The reaction was permitted to exotherm to 112° C. and was held at this temperature for fifteen minutes to insure complete polyamic acid formation. After fifteen minutes at 112° C., the polyamic acid formation was assumed to be complete.

At this point in the reaction scheme a Dean-Stark distillation trap was placed between the flask and the condenser. Imidization was effected by heating the flask from 112° C. to about 135° C. over a fifteen minute period. At 135° C. approximately 40 grams of distillate was collected. The collected distillate was poured into an equal volume of toluene. After phase separation, the bottom layer contained about 35 ml of water of condensation. After distillate was no longer collected at 135° C., the flask was heated to 160° C. while continually removing DMF. After the temperature 160° C. and 129.6 grams of DMF had been collected, the flask was cooled to 140° C. and 260 grams of methyl isobutyl ketone (MIBK) was slowly added to the flask. The product was cooled to 30° C. and stored for evaluation. The final product contained 50.2 percent solids and had a phenolic hydroxyl equivalent weight of 332 grams/phenolic OH equivalent.

EXAMPLE 2

Preparation of 1-Octadecene-N-p-Hydroxyphenyl Maleimide Copolymer

Example 1 was repeated except that the following materials were used:

| Material | Function | Wt. (gm) | Equiv. |
| --- | --- | --- | --- |
| "PA-18" | Anhydride Moiety | 287.4 | 0.912 |
| p-Aminophenol | Primary Aromatic Amine | 88.6 | 0.812 |
| Methyl cellosolve | Modifier | 7.6 | 0.100 |
| DMF | Solvent | 419.0 | |
| | | 802.6 | |
| H₂O Off | Water of Imidization | −14.6 | |
| | | 788.0 | |

The small quantity of methyl cellosolve that was included in the charge generated a low degree of one-half ester formation. This was done to remove excess anhydride functionality and was accomplished after the polyamic stage had been completed.

EXAMPLE 3

Preparation of laminating varnishes based on Examples 1 and 2

The following varnish compositions were prepared.

| | Composition | |
| --- | --- | --- |
| | A | B |
| Wt. % Copolymer of Ex 1 | 61.56 | — |
| Wt. % Copolymer of Ex 2 | — | 45.44 |
| Wt. % "Epon 829" | 38.44 | — |
| Wt. % "DER 521-A-75" | — | 54.56 |
| Impregnation Solids, Wt. % | 55.0 | 40.0 |
| Set-Time, Min. | 7.4 | 11.0 |
| Viscosity, cps | 250 | 300 |
| Impregnation Solvents | MIBK-DMF | Acetone/DMF/Cellosolve |
| Wt. % Br (Solids Basis) | None | 10.9 |

The two varnishes were formulated to contain 10 percent excess epoxide functionality (on an equivalent basis). They were prepared by charging an appropriate amount of the copolymer into a stainless steel beaker fitted with a propeller type agitator. The additional impregnation solvents were charged and the solutions mixed until uniform. The epoxy resins were then charged and the blend was mixed until uniform. (Fillers, pigments, and/or catalysts and the like could have been added at this stage.) The varnishes were stirred 15 minutes prior to impregnation on a style 7628 glass cloth.

Prepregs were prepared by immersing 15 inch by 15 inch sheets of the glass cloth into the varnishes and B-staging the varnishes in an oven at 150° C. for 3 minutes. After B-staging, the prepreg compositions contained 38.6 percent resin for Composition A and 34.5 percent resin for Composition B.

The B-staged prepregs were cut into seven inch by seven inch squares and were press laminated by stacking nine individual pieces between steel caul plates with Tedlar mold release sheets between the caul plates and the prepreg stack. The molding packs were placed into a cold press and were heated to 170° C. at 1,000 psi with an hour hold between 170° and 180° C. The stacks were cooled under pressure to prevent warping.

Thermogravimetric analysis of the varnishes was performed. Analysis showed that both laminates retained stability to nearly 400° C. with Composition B showing marginally better thermal stability in the vicinity of 400° C. Above 400° C. there is a sharp increase in weight loss followed by leveling out at 500° C. after about 86.5% of the starting weight has been lost. The conventionally prepared data was similar to thermogravimetric analysis data for totally aromatic polyimides except that decomposition temperatures are about 80° C. lower and less residue is attained. This is probably because the compositions of maleic anhydride copolymers used in the preparation of our disclosed polyimides are less stable.

Differential scanning calorimetry was also performed on the varnishes. No apparent melting points were observed between 25° C. and 400° C. despite the fact that both materials are soluble thermoplastics. Therefore, programmed heat-up to about 400° C. at 10° C. per minute leads to decomposition at 400° C. without passing through a melt stage.

Thermogravimetric analysis was also performed on the laminates. The analysis showed that "Epon 829" increased the thermal stability of the styrene N-p-hydroxyphenyl maleimide polymer. The stability was only slightly depressed and the laminate showed stability retention to about 400° C.

The influence of bromine upon thermal stability of the composition of this invention became apparent when the thermogravimetric analysis (TGA) data for Laminate A, prepared from composition A, was compared with TGA data for Laminate B, prepared from Composition B. The brominated crosslinked matrix (Laminate B) was considerably less stable than the other matrix. It is well established in the art that brominated crosslinked resin matrixes are inherently less thermally stable than non-brominated crosslinked matrixes so this was not surprising. TGA data for a conventional dicyandiamide-hardened tetrabrominated epoxy type FR-4 laminate was compared to the tetrabrominated crosslinked composition of this invention, and the tetrabrominated crosslinked composition of this invention was found to be substantially more thermally stable than conventional FR-4. The following table gives the comparison.

| Laminate B | | Conventional FR-4 | |
|---|---|---|---|
| Temp. (°C.) | Wt. % Loss | Temp. (°C.) | Wt. % Loss |
| 300 | 0 | 300 | 0.2 |
| 325 | 0.2 | 325 | 5.0 |
| 350 | 1.0 | 350 | 72.0 |
| 400 | 2.0 | 400 | — |

We claim:

1. A varnish comprising a solution in an organic solvent of a polyfunctional phenolic imide and an epoxy crosslinking agent in an amount from about stoichiometric to about 25% in excess of stoichiometric with said imide, said imide comprising the reaction product of a polyanhydride having at least three anhydride groups and an aromatic aminophenol having a single aromatic primary amine group.

2. A varnish according to claim 1 wherein said aminophenol has a single aromatic hydroxyl group.

3. A varnish according to claim 2 wherein said aminophenol is p-aminophenol.

4. A varnish according to claim 1 wherein aniline, in an amount up to ½ equivalent per equivalent of said polyanhydride, is reacted with said polyanhydride.

5. A varnish according to claim 1 wherein said polyanhydride is a copolymer of maleic anhydride and an ethylenically unsaturated monomer copolymerizable therewith which does not react with the anhydride group of said maleic anhydride.

6. A varnish according to claim 5 wherein said monomer is styrene.

7. A varnish according to claim 1 wherein said polyanhydride has the general formula:

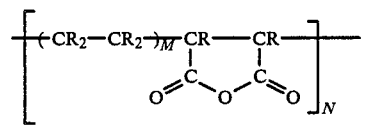

where M is up to 10 and N is 3 up to the solubility limit of said polyanhydride, and each R is independently selected from hydrogen, alkyl to $C_{10}$, aryl, aralkyl, and alkaryl.

8. A varnish according to claim 1 including an organic solvent to form a solution.

9. A varnish according to claim 8 wherein said solvent is unreactive with the anhydride groups of said polyanhydride.

10. A varnish according to claim 9 wherein said solvent is dimethyl formamide.

11. A varnish according to claim 8 wherein said solvent is a hydroxyl-containing solvent.

12. A varnish according to claim 1 wherein said epoxy is a diglycidyl ether of bisphenol A.

13. A varnish according to claim 1 which includes sufficient solvent to give a viscosity of about 50 to about 1000 centipoises.

14. A varnish according to claim 1 which includes up to about 1% of a catalyst.

15. A varnish according to claim 14 wherein said catalyst is 2-methyl imidazole.

16. A prepreg comprising a fibrous substrate impregnated with a partially cured varnish according to claim 1.

17. A prepreg according to claim 16 wherein said fibrous substrate comprises about 45 to about 65% of the weight of said prepreg and the resin solids of said varnish comprises about 35 to about 55% of the weight of said prepreg.

18. A laminate comprising a fully cured pressed stack of prepregs according to claim 16.

19. A laminate according to claim 18 wherein copper foil is bonded to at least one surface of said stack.

20. A circuit board comprising a laminate according to claim 19 wherein said copper foil is in the pattern of a circuit.

21. A method of making a varnish comprising preparing a solution in an organic solvent of a polyfunctional phenolic imide and an epoxy crosslinking agent in an amount of about stoichiometric to about 25% in excess of stoichiometric, said imide comprising the reaction product of a polyanhydride having at least three anhydride groups and an aromatic aminophenol having a single aromatic primary amine group.

22. A method according to claim 21 wherein said aminophenol has a single hydroxyl group.

23. A method according to claim 22 wherein said aminophenol is p-aminophenol.

24. A method according to claim 21 wherein is aniline, in an amount up to ½ equivalent per equivalent of said polyanhydride, is reacted with said polyanhydride.

25. A method according to claim 21 wherein said polyanhydride is a copolymer of maleic anhydride and an ethylenically unsaturated monomer copolymerizable therewith which does not react with the anhydride group of said maleic anhydride.

26. A method according to claim 25 wherein said monomer is styrene.

27. A method according to claim 21 wherein said polyanhydride has the general formula

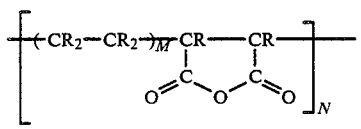

where M is up to 10 and N is 3 up to the solubility limit of said copolymer and each R is independently selected from alkyl to $C_{10}$, aryl aralkyl, and alkaryl.

28. A method according to claim 21 including adding a solvent to form a solution.

29. A method according to claim 28 wherein said solvent is unreactive with the anhydride groups of said polyanhydride.

30. A method according to claim 29 wherein said solvent is dimethyl formamide.

31. A method according to claim 28 wherein said solvent is a hydroxyl-containing solvent.

32. A method according to claim 21 wherein said epoxy crosslinking agent is a diglycidyl ether of bisphenol A.

33. A method according to claim 21 which includes sufficient solvent to give a viscosity of about 50 to about 1000 centipoises.

34. A method according to claim 21 which includes up to about 1% of a catalyst.

35. A method according to claim 34 wherein said catalyst is 2-methyl imidazole.

36. A method of making a prepreg comprising impregnating a fibrous substrate with a varnish according to claim 1, evaporating said solvent, and partially curing said impregnated phenolic imide.

37. A method of making a laminate comprising forming a stack of prepregs according to claim 16, and pressing said stack under heat to fully cure said phenolic imide.

* * * * *